United States Patent
Lai et al.

(10) Patent No.: US 7,292,443 B1
(45) Date of Patent: Nov. 6, 2007

(54) HEAT SINK MOUNTING ASSEMBLY

(75) Inventors: Cheng-Tien Lai, Tu-Cheng (TW); Cui-Jun Lu, Shenzhen (CN); Song-Shui Liu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/309,821

(22) Filed: Oct. 3, 2006

(51) Int. Cl.
*H05K 7/20* (2006.01)

(52) U.S. Cl. ............... 361/704; 361/719; 361/801; 165/80.3; 165/121; 165/185; 165/76; 257/712; 257/718; 257/719; 257/E23.086; 248/510; 174/16.3; 254/104; 16/223; 16/371

(58) Field of Classification Search ............. 361/704, 361/710, 718, 801; 165/80.3, 121, 185; 257/718, 257/719, E23.086; 174/16.3; 248/510
See application file for complete search history.

(56) References Cited

U.S. PATENT DOCUMENTS

| | | | |
|---|---|---|---|
| 5,771,155 A * | 6/1998 | Cook | 361/710 |
| 6,201,697 B1 * | 3/2001 | McCullough | 361/704 |
| 6,304,453 B1 | 10/2001 | Lo | |
| 6,430,051 B1 * | 8/2002 | Yang et al. | 361/704 |
| 6,450,248 B1 * | 9/2002 | Chang | 165/80.3 |
| 6,480,384 B2 * | 11/2002 | Lo | 361/704 |
| 6,944,026 B2 * | 9/2005 | Lee et al. | 361/704 |
| 6,948,554 B2 * | 9/2005 | Lee et al. | 165/80.3 |
| 7,079,401 B2 * | 7/2006 | Lee et al. | 361/801 |
| 7,133,288 B2 * | 11/2006 | DelPrete et al. | 361/719 |
| 7,218,520 B2 * | 5/2007 | Li et al. | 361/704 |
| 2005/0219823 A1 * | 10/2005 | Yu et al. | 361/704 |

* cited by examiner

*Primary Examiner*—Boris Chervinsky
*Assistant Examiner*—Courtney Smith
(74) *Attorney, Agent, or Firm*—Jeffrey T. Knapp

(57) ABSTRACT

A heat sink mounting assembly includes a retention module having a bottom and a pair of posts extending from the bottom. A heat sink is located on the bottom of the retention module. A clip spans across the heat sink and includes a clamping member having first and second legs releasably engaging with the posts of the retention module, and a pressing member having a first end thereof pivotably engaging with a first end of the clamping member. The pressing member has a pressing portion pressing the heat sink toward the retention module when a second end of the pressing member is depressed to engage with a pair of ears formed at a second end of the clamping member.

14 Claims, 4 Drawing Sheets

HEAT SINK MOUNTING ASSEMBLY

FIELD OF THE INVENTION

The present invention relates generally to mounting apparatuses, and more particularly to a mounting assembly for mounting a heat sink onto a heat generating electronic device.

DESCRIPTION OF RELATED ART

With advancement of computer technology, electronic devices operate at a high speed. It is well known that the more rapidly the electronic devices operate, the more heat they generate. If the heat is not dissipated duly, the stability of the operation of the electronic devices will be impacted severely. Generally, in order to ensure the electronic device to run normally, a heat sink is used to dissipate the heat generated by the electronic device. And in order to keep the heat sink intimately contacting the electronic device, a mounting assembly is usually desired for securing the heat sink to the electronic device.

Typically, a heat sink mounting assembly comprising a strip-shaped clip and a retention module is used widely. The clip is formed by stamping a metal sheet and has two ends thereof forming two locking portions respectively. The retention module is located around the electronic device. The retention module comprises retaining members for engaging with the locking portions of the clip. In use, the clip spans in a groove defined in a heat sink of the heat dissipation device resting on the electronic device. The locking portions of the clip are engaged with the retaining members of the retention module. Here, the clip is deformed and presses the heat sink to intimately contact with the electronic device. However, during the attachment of the heat sink to the electronic device, it is considerably laborious to overcome the rigidity of the clip to engage the locking portion with the retaining member of the retention module, and generally it needs tools to engage the locking portions of the clip with the retaining members of the retention module. So, it is inconvenient during the assembling operation.

What is needed, therefore, is a heat sink mounting assembly securing the heat sink to a heat generated device readily.

SUMMARY OF THE INVENTION

A heat sink mounting assembly in accordance with an embodiment of the present invention comprises a retention module comprising a bottom and a pair of posts extending from the bottom. A heat sink is located on the bottom of the retention module. A clip spans across the heat sink and comprises a clamping member having first and second legs releasably engaging with the posts of the retention module, and a pressing member having a first end thereof pivotably engaging with a first end of the clamping member. The pressing member has a pressing portion pressing the heat sink toward the retention module when a second end of the pressing member is pressed downwardly to engage with a second end of the clamping member.

Other advantages and novel features will become more apparent from the following detailed description of preferred embodiments when taken in conjunction with the accompanying drawings, in which:

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
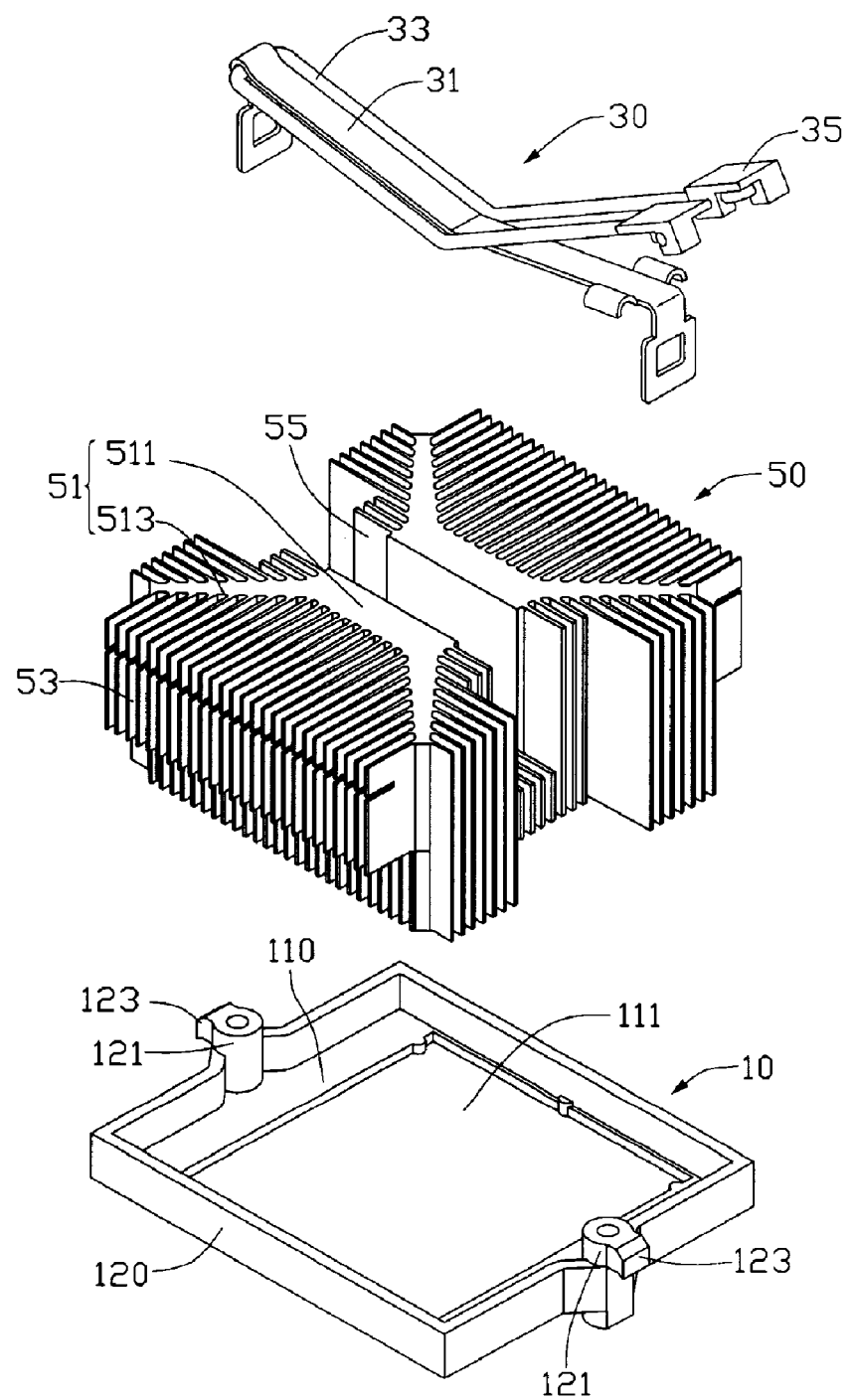
FIG. 1 is an exploded, isometric view of a heat sink mounting assembly in accordance with a preferred embodiment of the present invention, together with a heat sink.
Figure 2:
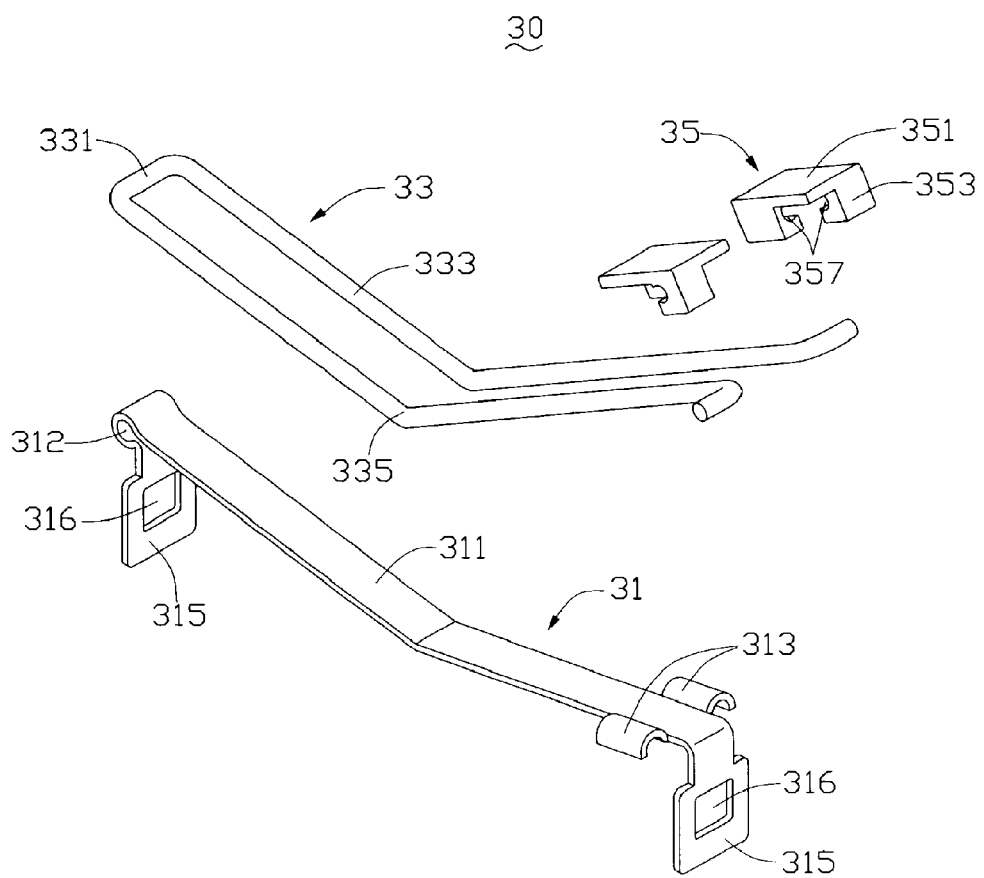
FIG. 2 is an exploded, isometric view of a clip shown in FIG. 1.

Referring to FIGS. 1 and 2, a heat sink mounting assembly in accordance with a preferred embodiment of the present invention is shown. The heat sink mounting assembly comprises a retention module 10 and a clip 30 cooperating with the retention module 10 to retain a heat sink 50 to an electronic device (not shown) located on a printed circuit board (not shown). The retention module 10 is secured on the printed circuit board with the electronic device being located within the retention module 10.

The heat sink 50 comprises a heat conducting portion 51 and a plurality of fins 53 extending from the heat conducting portion 51. The heat conducting portion 51 comprises a central portion 511 and four arms 513 extending from corners of the central portion 511. A thickness of each arm 513 decreases gradually from the central portion 511 to a tip of the arm 513. The fins 53 extend from the central portion 511 and the four arms 513. The four arms 513 divide the fins 53 into four regions. The fins 53 at each region are parallel to each other and are perpendicular to the fins 53 at an adjacent region. A channel 55 transversely extends through the heat sink 50, and divides the heat sink 50 into two symmetric portions (not labeled) connecting at a bottom of the heat sink 50. The heat conducting portion 51 at each of the two portions of the heat sink 50 is substantially V-shaped.

The retention module 10 is a substantially rectangular frame, and comprises a bottom 110 for supporting the heat sink 50 thereon and four interconnected sidewalls 120 extending upwardly from four sides of the bottom 110, respectively. The bottom 110 defines an opening 111 for accommodating the electronic device therein. Two opposite sidewalls 120 each extend a post 121 at a middle portion thereof. Two opposite hooks 123 extend from the two posts 121 of the two sidewalls 120, respectively.

The clip 30 comprises a clamping member 31, a pressing member 33 assembled with the clamping member 31, and an operating member 35 positioned at one end of the pressing member 33. The clamping member 31 is substantially M-shaped in profile, and comprises an elongated main body 311 and two clamping legs 315 extending downwardly from two ends of the main body 311. The main body 311 is substantially V-shaped, and has one end thereof bent to define a hole 312 therethrough. A pair of ears 313 extends from two opposite edges of the main body 311. The pair of ears 313 is located adjacent an opposite end of the main body 311. The two legs 315 each define a hole 316 therein.

The pressing member 33 is formed by bending a metal wire having a good strength, and comprises a connecting portion 331 and a pair of pressing beams 333 extending from two ends of the connecting portion 331 along a same direction. The connecting portion 331 is pivotably received in the hole 312 of the main body 311 of the clamping member 31. The two pressing beams 333 are located at two opposite sides of the main body 311, and each is substantially V-shaped and comprises a pressing portion 335 bent downwardly at a middle portion thereof. A distal portion (not labeled) of each pressing beam 333, which is remote from the connection portion 331 is bent outwardly. The operating member 35 comprises two pieces each having a top plate 351 and a pair of positioning feet 353 depending from the top plate 351. The feet 353 define two grooves 357 substantially perpendicular to each other. The operating member 35 is attached to the distal portions of the pressing beams 333 via the pressing beams 333 engaging in the grooves 357 of the operating member 35.

Figure 3:
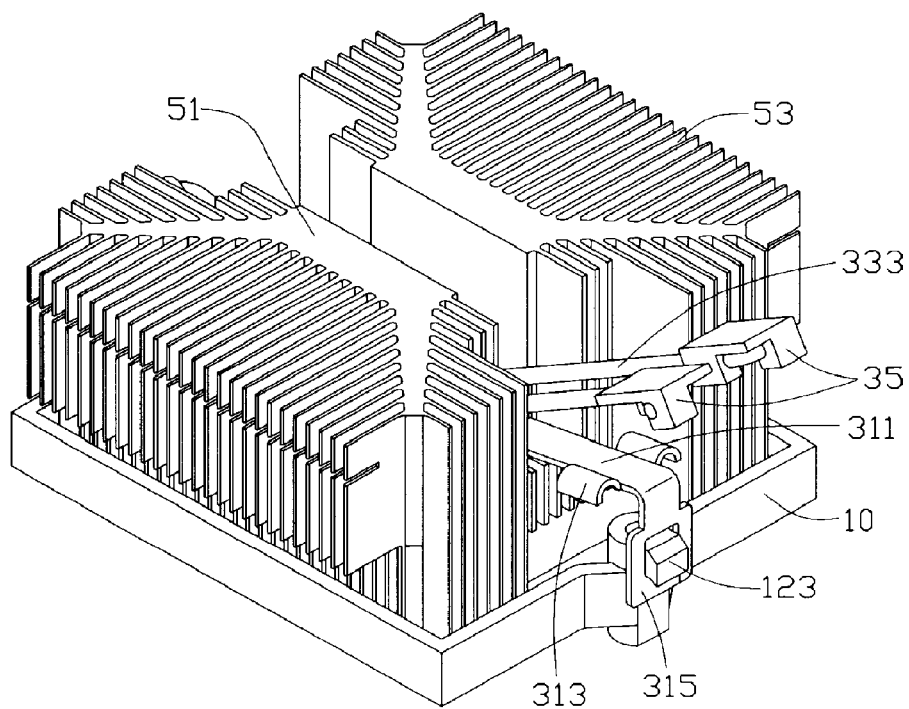
FIG. 3 is an assembled view of FIG. 1 with the clip in an unlocked position.
Figure 4:
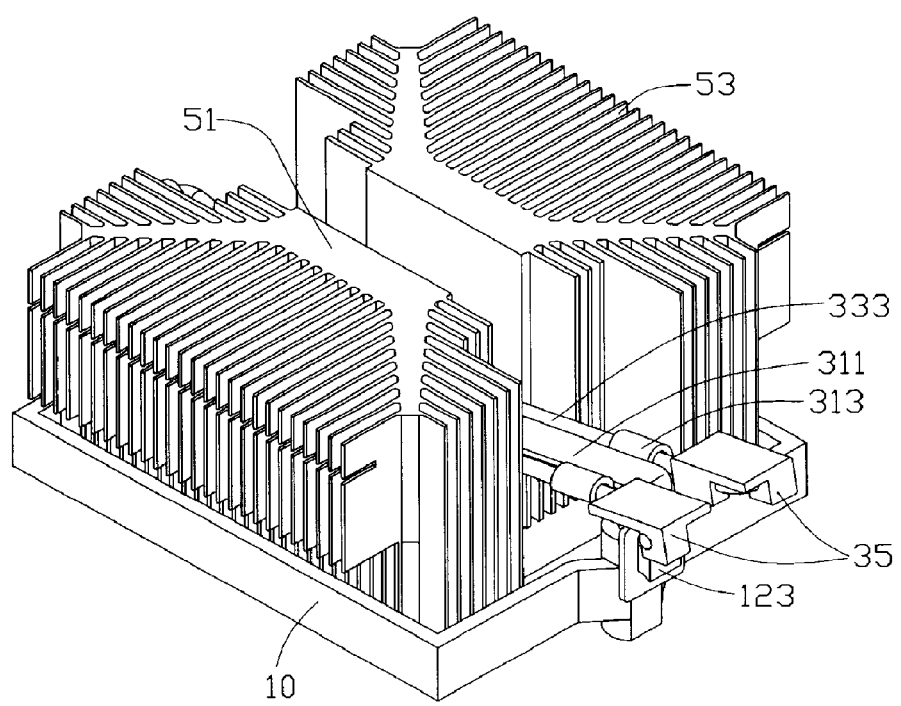
FIG. 4 is an assembled view of FIG. 1 with the clip in a locked position.

Referring to FIGS. 3 and 4, in assembly, the heat sink 50 is located on the bottom 110 of the retention module 10 with a bottom of the heat conducting portion 51 contacting the electronic device. The clip 30 spans in the channel 55 of the heat sink 50. The two legs 315 of the clamping member 31 of the clip 30 extend downwardly from the heat sink 50, and releasably engaging with the retention module 10 via the hooks 123 of the retention module 10 engaged in corresponding holes 316 of the legs 315. As illustrated in FIG. 3, the clip 30 is in an unlocked position, right portions (not labeled) of the pressing beams 333 of the pressing member 33 of the clip 30 tilt upwardly away the main body 311 of the clamping member 31. Pressing the operating member 35 downwardly, the pressing beams 333 move downwardly to the main body 311 and engage with bottom surfaces (not labeled) of corresponding ears 313 of the main body 311. Each ear 313 has an arc-shaped configuration. Therefore, as illustrated in FIG. 4, the clip 30 is in a locked position, the ears 313 of the main body 310 lock the pressing beams 333 at the downwardly pressed position. The pressing portions 335 of the pressing member 33 abut against the heat sink 50 in the channel 55. Under the action of the pressing beams 333 to the main body 311, the legs 315 of the clamping member 31 move upwardly to firmly engage with the hooks 123 of the retention module 10. The pressing portions 335 of the pressing member 33 press the heat sink 50 downwardly to intimately contact the electronic device.

Inversely, to remove the heat sink 50 away from the electronic device, the operating member 35 of the clip 30 is pressed downwardly to a position wherein the pressing beams 333 of the pressing member 33 of the clip 30 are disengaged from the ears 313 of the clamping member 31 of the clip 30. Then, the pressing beams 33 are moved outwardly to leave the ears 313, and the downwardly pressing force on the operating member 35 is released, whereby the pressing beams 33 return to their original position as shown in FIG. 3. Thus, the pressing portions 335 of the pressing member 33 are released from pressing the heat sink 50. The legs 315 of the clamping member 31 can be disengaged from the retention module 10. By this, the heat sink 50 can be removed from the retention module 10 and away from the electronic device.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat sink assembly comprising:
   a retention module comprising a bottom and a pair of posts extending from the bottom;
   a heat sink located on the retention module; and
   a clip spanning across the heat sink and comprising a clamping member having first and second legs engaging with the posts of the retention module, and a pressing member having a first end thereof pivotably engaging with a first end of the clamping member;
   wherein the pressing member has a pressing portion pressing the heat sink toward the retention module when a second end of the pressing member is moved to engage with a second end of the clamping member
   wherein a main body of the clamping member of the clip has the first end thereof defining a hole, the pressing member comprises a connecting portion at the first end thereof pivotably engaging in the hole, and two pressing beams extending from the two ends of the connecting portion along a same direction, the two pressing beams being located at two sides of the main body, the pressing portion being formed by the pressing beams;
   the clamping member of the clip extends a pair of ears at the second end thereof, the pressing beams of the pressing member of the clip being locked by the ears when the second end of the pressing member is moved to engage with the second end of the clamping member.

2. The heat sink assembly of claim 1, wherein the heat sink defines a channel therein, the clamping member of the clip comprises the main body received in the channel, the first and second legs extending from two ends of the main body.

3. The heat sink assembly of claim 2, wherein the clamping member is substantially M-shaped in profile, the main body of the clamping member is substantially V-shaped in profile.

4. The heat sink assembly of claim 1, wherein the pressing portion is formed at a middle portion of the pressing beams and bent toward the heat sink.

5. The heat sink assembly of claim 4, wherein the two pressing beams each is substantially V-shaped in profile.

6. The heat sink assembly of claim 1, wherein ends of the pressing beams of the pressing member which are remote from the connecting portion connect with an operating member for facilitating operation of the pressing beams.

7. The heat sink assembly of claim 1, wherein the pair of posts of the retention module form two hooks, the two legs of the clamping member of the clip define two holes receiving the hooks therein.

8. A heat sink assembly comprising:
   a heat sink;
   a retention module supporting the heat sink thereon, and extending a pair of posts; and
   a clip resting on the heat sink and comprising a clamping member having a pair of legs engaging with the pair of posts of the retention module, and a pressing member having a connecting portion engaging with the clamping member and a pair of pressing beams extending from the connecting portion, the pressing beams being pressed to engage with the clamping member such that pressing portions of the pressing beams press the heat sink toward the retention module wherein the clamping member extends a pair of ears, the pressing beams of the pressing member engaging with corresponding ears when the clip is in a locked position.

9. The heat sink assembly of claim 8, wherein the clamping member is formed by bending a metal wire.

10. The heat sink assembly of claim 9, wherein the pressing beams of the pressing member of the clip each are substantially V-shaped in profile, and have a distal end bent outwardly, the distal end being attached with an operating member thereon for facilitating operation of the pressing beams.

11. The heat sink assembly of claim 8, wherein the heat sink defines a channel receiving the clip therein.

12. The heat sink assembly of claim 8, wherein the heat sink comprises a heat conducting portion and a plurality of fins extending from the heat conducting portion.

13. The heat sink assembly of claim 12, wherein the heat conducting portion comprises a central portion and a plurality of arms extending from the central portion, the arms dividing the fins into a plurality of regions.

14. The heat sink assembly of claim 13, wherein the fins at a same region are parallel to each other.

* * * * *